(12) United States Patent
Yan

(10) Patent No.: US 8,912,023 B2
(45) Date of Patent: Dec. 16, 2014

(54) METHOD AND SYSTEM FOR FORMING LED LIGHT EMITTERS

(71) Applicant: LedEngin, Inc., San Jose, CA (US)

(72) Inventor: Xiantao Yan, Palo Alto, CA (US)

(73) Assignee: LedEngin, Inc., San Jose, CA (US)

( * ) Notice: Subject to any disclaimer, the term of this patent is extended or adjusted under 35 U.S.C. 154(b) by 0 days.

(21) Appl. No.: 13/781,095

(22) Filed: Feb. 28, 2013

(65) Prior Publication Data

US 2013/0228804 A1   Sep. 5, 2013

Related U.S. Application Data

(60) Provisional application No. 61/606,355, filed on Mar. 2, 2012.

(51) Int. Cl.

| | | |
|---|---|---|
| *H01L 21/00* | (2006.01) | |
| *H01L 33/48* | (2010.01) | |
| *H01L 33/08* | (2010.01) | |
| *F21K 99/00* | (2010.01) | |
| *F21V 5/04* | (2006.01) | |
| *F21Y 101/02* | (2006.01) | |
| *F21V 5/00* | (2006.01) | |
| *H05K 1/18* | (2006.01) | |
| *H01L 33/58* | (2010.01) | |
| *H01L 25/075* | (2006.01) | |

(52) U.S. Cl.
CPC . *H01L 33/08* (2013.01); *F21V 5/04* (2013.01); *F21Y 2101/02* (2013.01); *F21V 5/007* (2013.01); *H05K 1/189* (2013.01); *H01L 33/48* (2013.01); *H01L 33/58* (2013.01); *H05K 2201/10106* (2013.01); *F21K 9/90* (2013.01); *H01L 25/0753* (2013.01)
USPC .......................................................... 438/29

(58) Field of Classification Search
None
See application file for complete search history.

(56) References Cited

U.S. PATENT DOCUMENTS

| | | | |
|---|---|---|---|
| 8,075,165 B2 | 12/2011 | Jiang et al. | |
| 8,384,097 B2 | 2/2013 | Yan | |
| 2011/0031516 A1* | 2/2011 | Basin et al. | 257/98 |
| 2011/0309398 A1* | 12/2011 | Ito et al. | 257/98 |
| 2012/0286669 A1 | 11/2012 | Yan et al. | |

FOREIGN PATENT DOCUMENTS

| | | |
|---|---|---|
| JP | 2000-349346 | 12/2000 |
| JP | 2000-349347 | 12/2000 |
| JP | 2001-057445 | 2/2001 |
| JP | 2002-185046 | 6/2002 |
| JP | 2004-241704 | 8/2004 |
| JP | 2004-253404 | 9/2004 |

OTHER PUBLICATIONS

International Search Report and Written Opinion of PCT Application No. PCT/US2009/069070, dated Mar. 1, 2010, 9 pages total.

(Continued)

*Primary Examiner* — Seahvosh Nikmanesh
(74) *Attorney, Agent, or Firm* — Kilpatrick Townsend & Stockton LLP

(57) ABSTRACT

A method for forming a flexible sheet of LED light emitters includes forming a micro lens sheet having a plurality of micro lenses, forming a phosphor sheet including a wavelength converting material, forming a flexible circuit sheet, forming a ceramic substrate sheet including a plurality of LED light emitters, and forming a support substrate including a thermally conductive material. The method also includes attaching the above sheets to form a stack including, from top to bottom, the micro lens sheet, the phosphor sheet, the flexible circuit sheet, the ceramic substrate sheet, and the support substrate.

13 Claims, 3 Drawing Sheets

(56) References Cited

OTHER PUBLICATIONS

Kading, O.W., "Thermal Conduction in Metallized Silicon-Dioxide Layers on Silicon," Applied Physics, Sep. 1994, vol. 65, No. 13, pp. 1629-1631.
Non-Final Office Action for U.S. Appl. No. 12/756,861, mailed of Jan. 18, 2012, 18 pages.
Notice of Allowance for U.S. Appl. No. 12/756,861.
Notice of Allowance for U.S. Appl. No. 12/420,802.
Official Action for Japanese Patent Application No. 2005-315149, dated Jul. 21, 2009, 3 pages total.
Requirement for Restriction/Election for U.S. Appl. No. 12/420,802, mailed of Jun. 6, 2011, 6 pages.
"Solvent Soluble Polyimide with High Transparency and High Tg: HOP-400, 500," Hitachi Cable Review, Aug. 2003, No. 22, p. 78.
Yan, Xiantao, "Two Test Specimens for Determining the Interfacial Fracture Toughness in Flip-Chip Assemblies," Jun. 1998, Transactions of the ASME, vol. 120, pp. 150-155.
Yan, Xiantao, "Analysis Based Design Guidelines for Metal Runner and Passivation Layers in IC Packaging," DELPHI Automotive Systems, Analytical Engineering Conference, May 2000, pp. 1-4.

* cited by examiner

METHOD AND SYSTEM FOR FORMING LED LIGHT EMITTERS

CROSS-REFERENCES TO RELATED APPLICATIONS

This application claims priority to U.S. Provisional Patent Application No. 61/606,355, filed Mar. 2, 2012, commonly owned and incorporated by reference herein in its entirety. This application is also related to co-pending and commonly owned U.S. patent application Ser. No. 12/420,802, filed Apr. 8, 2009, entitled "Total Internal Reflection Lens And A Mechanical Retention And Locating Device," U.S. patent application Ser. No. 12/756,861, filed Apr. 8, 2010, entitled "Package for Multiple Light Emitting Diodes," and U.S. patent application Ser. No. 13/106,808, filed May 12, 2011, entitled "Tuning Of Emitter With Multiple LEDS To A Single Color Bin." The disclosures of all of the above applications are incorporated by reference herein in their entirety.

BACKGROUND OF THE INVENTION

The present invention relates in general to lighting devices based on light-emitting diodes (LEDs) and the methods for manufacture.

Lighting devices based on LEDs are becoming more popular. As the demands for these lighting devices continue to increase, the cost of the LED dice have been decreasing. On the other hand, the cost of other components in the LED emitter makes it difficult to lower the over-all system cost. In order for LED-based lighting devices to satisfy the requirement of various potential applications, the over-all system cost needs to be reduced. Therefore, the need for cost-effective manufacturing techniques is becoming more critical in LED-based lighting devices.

BRIEF SUMMARY OF THE INVENTION

As the price of LED dice continue to drop, conventional methods of manufacturing LED light emitters are limited by the cost of other components and the cost of assembly the lighting devices as a whole. For example, the LED die are usually disposed on a substrate, which provides electrical connection and thermal conduction. The LED die and substrate are usually mounted on an MCPCB (metal-core printed circuit board), which has been widely used in packaging LED light emitters. The cost of packaging individual emitters often becomes a substantial part of the over-cost the LED emitters.

According to embodiments of the present invention, a method for forming multiple LED emitters includes using sheets of materials, including lens sheet, phosphor sheet, connector sheet, LED and substrate sheet, etc. The assembled sheets are then singulated to form individual emitters that can be interconnected by flexible and/or stretchable sheets.

According to an embodiment of the present invention, a method for forming a flexible sheet of LED light emitters includes forming a micro lens sheet having a plurality of lenses, forming a phosphor sheet including a wave-length converting material, forming a flexible circuit sheet of conductive patterns, forming a ceramic substrate sheet including a plurality of LED light emitters, and forming a support substrate including a thermally conductive material. The method also includes attaching the above sheets to form a stack including, from top to bottom, the lens sheet, the phosphor sheet, the flexible circuit sheet, the ceramic substrate sheet, and the support substrate.

In some embodiments, the method includes forming the stack of sheets using thermal energy. In other embodiments, the method includes forming the stack of sheets using mechanical pressure.

In some embodiments of the above method, the micro lens sheet includes a glass material. In some embodiments the micro lens sheet comprises a plurality of preformed notches or cracks. In an embodiment, the flexible circuit sheet includes conductive lines and solder joints formed on a flexible and stretchable material.

In other embodiments, the ceramic substrate sheet includes a plurality of preformed notches or cracks. In some embodiments, the method also includes simulating the flexible sheet of LED light emitters by breaking lens sheet at the preformed notches or cracks. In some embodiments, the method also includes singulating the flexible sheet of LED light emitters by passing the flexible sheet through one or more rollers. In some embodiments, the flexible sheets are also stretchable, and the conductive wires can be formed in zig-zag shape.

According to another embodiment of the present invention, a flexible sheet of LED light emitters includes a support substrate including a thermally conductive material, a ceramic substrate sheet overlying support substrate. The ceramic substrate sheet includes a plurality of LED light emitters. The flexible sheet of LED light emitters also includes a flexible circuit sheet overlying the substrate sheet, and a phosphor sheet overlying the flexible circuit sheet, the phosphor sheet including a wave-length converting material. The flexible sheet of LED light emitters also includes a lens sheet overlying the phosphor sheet. The lens sheet includes a plurality of lenses.

In some embodiments, the flexible sheet of LED light emitters is also stretchable. Each of the plurality of lenses in the lens sheet is aligned to a corresponding one of the plurality of LED light emitters. In some embodiments, the lens sheet includes pre-formed notches or cracks between adjacent lenses.

In some embodiments, the ceramic substrate includes pre-formed notches or cracks between adjacent emitters. In some embodiments, the lens sheet includes separate lenses. In certain embodiments, the ceramic substrate includes separate LED emitters.

A further understanding of the nature and advantages of the present invention may be realized by reference to the remaining portions of the specification and the drawings.

DETAILED DESCRIPTION OF THE INVENTION

The description below is presented with reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Figure 1:
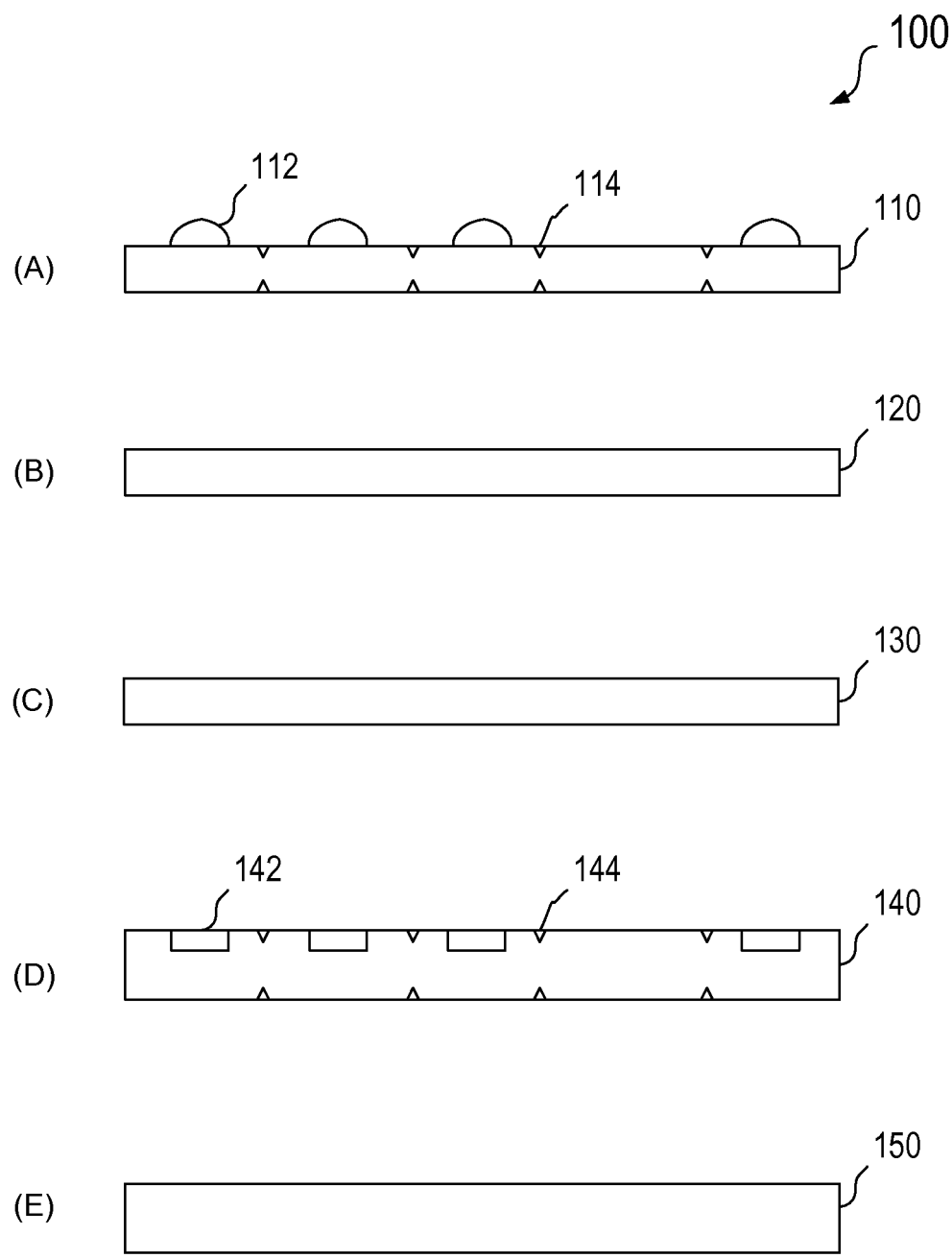
FIG. 1 shows the component of a flexible sheet of LED emitters according to an embodiment of the present invention.

FIG. 1 shows the components of a flexible sheet of LED emitters according to an embodiment of the present invention. As shown, the components of a flexible sheet of LED emitters 100 include a lens sheet 110, a phosphor sheet 120, a flexible circuit sheet 130, an emitter sheet 140 which can include a ceramic substrate sheet with embedded LEDs, and a flexible support substrate 150. These components are described in more details below.

Lens sheet 110 includes a sheet of transparent material with lenses 112. The transparent material can be an optically transparent material suitable for forming lenses. For example, glass or silicone can be used to form the lens sheet. In some embodiments, the lens sheet is made by molding glass or silicone, and the lenses can be formed integrally with the sheet. As shown in FIG. 1, lens sheet is a connected sheet with lenses formed therein.

In a conventional LED emitter, a primary lens is usually used to extract light from the LED die, and a secondary lens is often used for beam forming purposes. In some cases, the primary lens may form part of the emitter, and the secondary lens may be part of a housing. Examples of lenses are described in U.S. patent application Ser. No. 12/420,802, filed Apr. 8, 2009, entitled "Total Internal Reflection Lens And A Mechanical Retention And Locating Device." In some embodiments of the present invention, the lens can perform the functions both the primary lens and secondary lens, i.e., both light extracting and beam forming. In some embodiments, the lens sheet is made from silicone, and the sheet can remain flexible. In some embodiments, a glass lens sheet is used to take advantage of the better heat conductive properties of glass than silicone. Lens sheets made from glass can be rigid. In some embodiments, preformed notches or cracks 114 are formed in the lens sheet to facilitate singulation as described below. In an example, these notches or cracks can be made by laser. In other example, the notches or cracks can be formed by a mechanical method. In some examples, notches or cracks are formed on both front and back sides of the sheet and penetrate partially into the sheet. In other examples, the notches or cracks can be formed on only the front side or the back side.

In FIG. 1, phosphor sheet 120 is for light wavelength conversion. Phosphor sheet 120 in combination with the emitters in emitter sheet 140 allows the emission of desirable light colors. For example, light from a blue LED passing through a yellow phosphor can produce a white light. In some embodiments, the phosphor sheet can include a mixture of phosphors, for example, yellow and red phosphors. In some embodiments, the phosphor particles are uniformly distributed in a base material of, e.g., silicone. The phosphor sheet can be pre-formed and then attached to a target sheet. Alternatively, the phosphor sheet can be formed on a target sheet, for example, by painting.

Flexible circuit sheet 130 includes conductive lines that make contacts to the LED emitters in emitter sheet 140. In some embodiments, flexible circuit sheet 130 can include a flexible plastic sheet made of, e.g., polyimide or polyester, etc. In some embodiments, circuit sheet 130 can include conductive patterns formed in the sheet or over the sheet, and can also include solder joints or connectors. The flexible material can protect solder joints, electrical contacts, and wires that are formed on the sheet or embedded in the sheet. The conductive patterns may be printed on the plastic sheet.

In some embodiments, circuit sheet 130 can be made of a stretchable material, for example, a polymer such as polyimide. In some embodiments, the conductive wires can be made in zig-zag shapes to allow stretching. The stretching may occur during manufacturing (e.g., roller for simulation) or in actual use (e.g., when extended to cover a non-planar target area). As described below, circuit sheet 130 is also configured to allow access and control of individual LED dice.

In FIG. 1, LED emitter sheet 140 includes multiple LED emitters 142 built on a substrate. In some embodiments, the substrate is a ceramic substrate sheet configured to accommodate multiple emitters, wherein each emitter can have multiple embedded LED dice. In embodiments of the invention, these LED dice are inorganic solid-state based LED light sources. In some embodiments, the substrate includes a stack of multiple layers for providing improved heat conduction and electrical contacts. In some embodiments, the design of the substrate allows individual LED die in an emitter to be separately addressable. Along with the flexible and, in some cases, stretchable circuit sheet 130, this arrangement allows tuning of the light color. Examples of substrate and emitters and light tuning are described in U.S. patent application Ser. No. 12/756,861, filed Apr. 8, 2010, entitled "Package for Multiple Light Emitting Diodes," and U.S. patent application Ser. No. 13/106,808, filed May 12, 2011, entitled "Tuning Of Emitter With Multiple LEDS To A Single Color Bin." The disclosures of all of the above applications are incorporated by reference herein in their entirety.

The ceramic substrate sheet tend to be rigid. In some embodiments, pre-formed notches or cracks 144 are formed in the substrate allow singulation. Similar to the notches or cracks described above in connection with the lens sheet, the notches or cracks in the substrate can be made by laser. In other example, the notches or cracks can be formed by a mechanical method. In some examples, notches or cracks are formed on both front and back sides of the sheet and penetrate partially into the sheet. In other examples, the notches or cracks can be formed on only the front side or the back side. In some embodiments, no electrical contacts are formed at the bottom layer.

In FIG. 1, sheet 150 is a support substrate, for example, a sheet of thermal pad, which is thermally conductive for heat dissipation. The material for sheet 150 can be selected from conventional thermal interface material (TIM). In some embodiments, sheet 150 can be disposed on a heat sink. Sheet 150 can also include a protective layer. In some embodiments, no back-side electrical contacts to the emitters are provided.

According to another embodiment of the invention, the sheets described above can be made separately. These sheets are then stacked together, e.g., by lamination, to form an assembled sheets of LED emitters. In an embodiment, a method for forming a flexible sheet of LED light emitters includes forming the individual sheets, which can include:
  forming a lens sheet having a plurality of micro lenses;
  forming a phosphor sheet including a wave-length converting material;
  forming a flexible circuit sheet;
  forming a ceramic substrate sheet including a plurality of LED light emitters; and
  forming a support substrate including a thermally conductive material.

In some embodiments, these sheets are then brought together to form a stack including, from top to bottom, the lens sheet, the phosphor sheet, the flexible circuit sheet, the ceramic substrate sheet, and the support substrate. In other embodiments, one or more sheets can be omitted, or disposed in a different position. For example, in some embodiments a flexible circuit sheet can be formed below the LED sheet, instead of above the LED sheet. In other embodiments, a flexible circuit sheet can be formed above and below the LED sheet to provide electrical connections.

Figure 2:
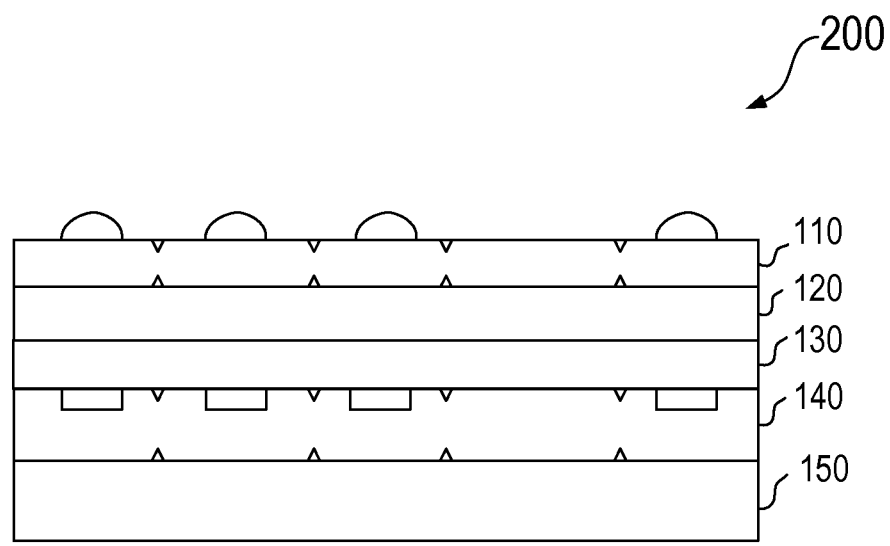
FIG. 2 illustrates an assembled sheet of LED emitters according to an embodiment of the present invention.

FIG. 2 illustrate an assembled sheet of LED emitters 200, including a lens sheet 110, a phosphor sheet 120, a flexible circuit sheet 130, an LED sheet 140 which includes a ceramic substrate sheet with embedded LEDs, and a flexible support substrate 150, which are described above in connection with FIG. 1. These sheets are attached together to form the sheet of LED emitters 200 using thermal energy or mechanical pressure. The attachment can also be accomplished by lamination methods.

Figure 3:
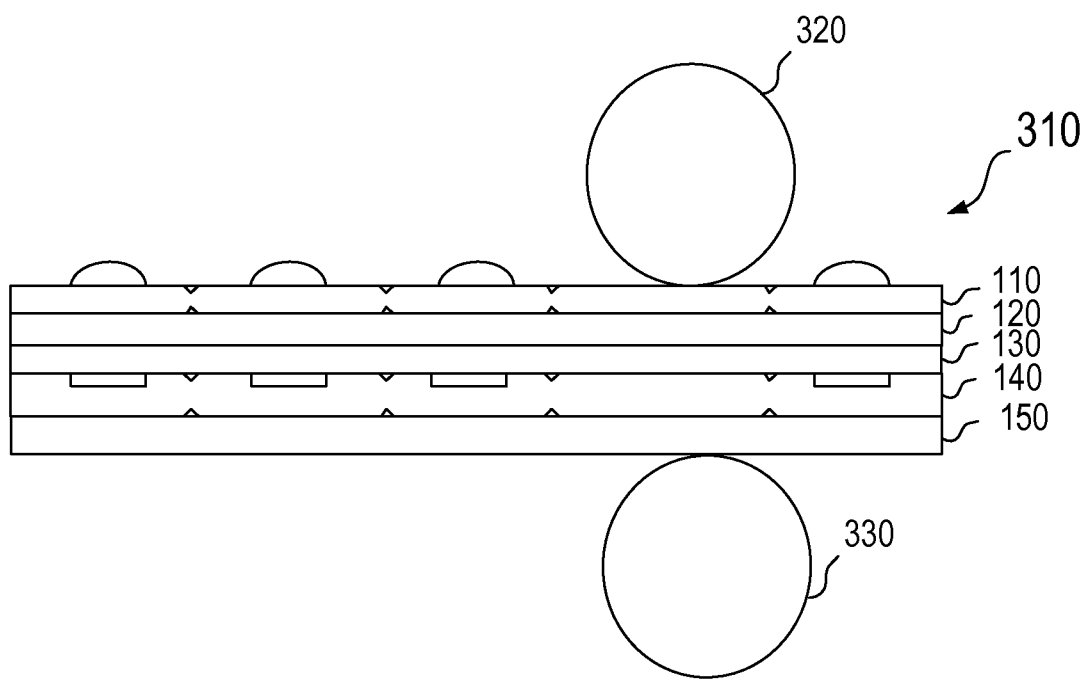
FIG. 3 illustrate a method for singulating the emitters from a sheet of emitters.

FIG. 3 illustrate a method for singulating the emitters from a sheet of emitters. As shown, a flexible sheet of emitter 310 is passed through rollers 320 and 330. The pressure from the rollers causes the pre-formed notches or cracks in the micro-lens sheet 110 and the ceramic sheet 140 to break into multiple pieces, which are held together by flexible sheets 120, 130, and 150. As a result, the sheet of emitter 310 becomes flexible. As described above, sheets 120, 130, and 150 can be flexible and stretchable. Depending on the embodiments, one or more rollers may be used in the singulation step.

Figure 4:
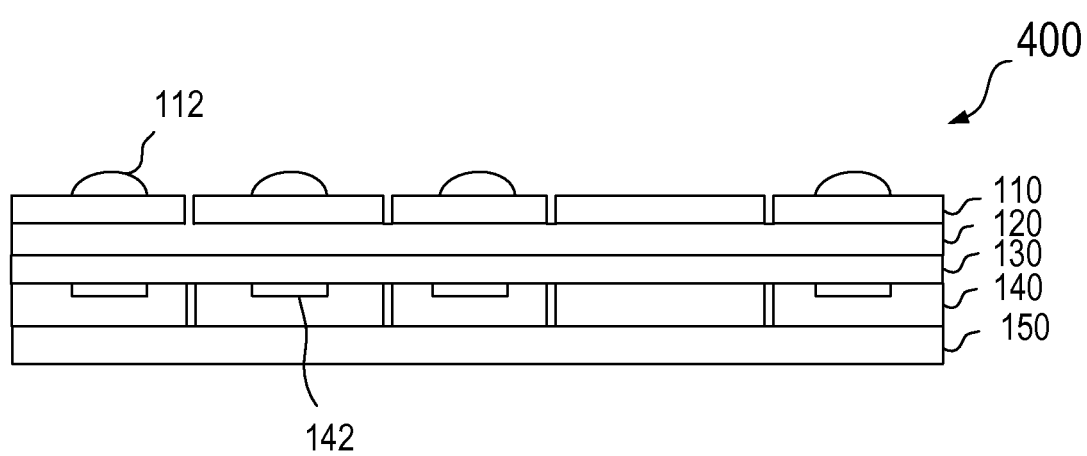
FIG. 4 illustrates a flexible sheet of LED emitters after singulation according to an embodiment of the present invention.

FIG. 4 illustrates a flexible sheet of LED emitters after singulation according to an embodiment of the present invention. As can be seen in FIG. 4, lens sheet 110 and the emitter substrate sheet 140 include individual lenses 112 and emitters 142 separated in the singulation process. In embodiments of the invention, the lens and the LED emitters are properly aligned. Further, circuit sheet 130 includes interconnect conductors that are also aligned with emitter substrate sheet 140.

In flexible electronics, electronic circuits can be formed by mounting electronic devices on flexible plastic substrates, such as polyimide, PEEK or transparent conductive Polyester film. Additionally, flex circuits can be screen printed silver circuits on polyester. Flexible electronic assemblies can often be manufactured using identical components as those used for rigid printed circuit boards, allowing the board to conform to a desired shape, or to flex during its use. As described above, in embodiments of the present invention, the components for multiple LED emitters are formed in sheets of materials. In some embodiments, phosphor sheet 120, circuit sheet 130, and protective sheet 150 can be made of flexible and stretchable material, and lens sheet 110 and emitter sheet 140 can be rigid with pre-formed notches or cracks. After singulation, the emitters and lenses for individual emitters are held together by the flexible and stretchable layers as described above. The interconnects in circuit layer 130 can be formed in zig-zag shapes to allow movement of the LED emitters when the substrate is flexed or stretched. Depending on the embodiments, phosphor sheet 120, circuit sheet 130, and protective sheet 150 can be made of flexible, stretchable, or flexible and stretchable materials.

As described above, flexible, stretchable, or flexible and stretchable, sheets of LED emitters can be made using the method and structures provided by embodiments of the present invention. Embodiments of the present invention can provide one or more of the following benefits over conventional techniques. For example, the methods and structures can be used in mass production of LED emitters, lowering the manufacturing cost. In some embodiments, the singulated emitters can be separated by cutting the remaining sheets. In other embodiments, the flexible, stretchable, or flexible and stretchable sheets of LED emitters can be used in different applications. These applications includes flat panels, wall lighting (e.g., the sheet of LED emitters cab be pasted on target area), lighting on a non-flat surface, clothing (signage on jackets or shirts signage for safety, for example). In other embodiments, the emitter sheets also can find applications in traffic control. For example, the emitter sheets can be disposed at road side or even as part of the pavement for providing lighting or traffic signs.

In the above description, specific circuits and examples are used to illustrate the embodiments, it is understood that the examples and embodiments described herein are for illustrative purposes only and that various modifications or changes in light thereof will be suggested to persons skilled in the art and are to be included within the spirit and purview of this invention.

What is claimed is:

1. A method for forming a flexible sheet of light-emitting diode (LED) light emitters, comprising:
    forming a lens sheet having a plurality of micro lenses;
    forming a phosphor sheet including a wave-length converting material;
    forming a flexible circuit sheet;
    forming a ceramic substrate sheet including a plurality of LED light emitters;
    forming a support substrate including a thermally conductive material; and
    forming a sheet of LED emitters by forming a stack of sheets including the micro lens sheet, the phosphor sheet, the flexible circuit sheet, and the ceramic substrate sheet.

2. The method of claim 1, wherein the sheet of LED emitters also comprises the support substrate.

3. The method of claim 1, wherein forming the stack of sheets comprises applying thermal energy.

4. The method of claim 1, wherein forming the stack of sheets using mechanical pressure.

5. The method of claim 1, wherein the micro lens sheet comprises a glass material.

6. The method of claim 1, wherein the micro lens sheet comprises a plurality of preformed notches or cracks.

7. The method of claim 1, wherein the flexible circuit sheet comprises conductive lines and solder joints formed on a flexible and stretchable material.

8. The method of claim 1, wherein the flexible circuit sheet comprises conductive lines formed in zig-zag shapes.

9. The method of claim 1, wherein the ceramic substrate sheet comprises a plurality of preformed notches.

10. The method of claim 1, further comprising singulating the lens sheet of by separating the lens sheet at the preformed notches.

11. The method of claim 1, further comprising singulating the flexible sheet of LED light emitters by separating the ceramic substrate sheet at the preformed notches.

12. The method of claim 1, further comprising singulating the flexible sheet of LED light emitters by passing the flexible sheet through one or more rollers.

13. The method of claim 1, where in the flexible sheets are also stretchable, and the conductive wires are in zig-zag form.

* * * * *